United States Patent [19]

Hanley et al.

[11] Patent Number: 5,565,834
[45] Date of Patent: Oct. 15, 1996

[54] MAGNETIC ASSEMBLY FOR A NUCLEAR MAGNETIC RESONANCE IMAGING SYSTEM

[75] Inventors: Peter Hanley, Forest of Dean; Ian L. McDougall, Charlbury, both of United Kingdom

[73] Assignee: Oxford Instruments Limited, Oxon, United Kingdom

[21] Appl. No.: 307,644

[22] PCT Filed: Mar. 17, 1993

[86] PCT No.: PCT/GB93/00550

§ 371 Date: Dec. 7, 1994

§ 102(e) Date: Dec. 7, 1994

[87] PCT Pub. No.: WO93/19475

PCT Pub. Date: Mar. 17, 1993

[30] Foreign Application Priority Data

Mar. 19, 1992 [GB] United Kingdom ............... 9206014

[51] Int. Cl.$^6$ ............... H01F 1/00; H01F 7/00; G01R 33/28
[52] U.S. Cl. ............... 335/296; 335/301; 335/306; 324/319
[58] Field of Search ............... 335/301, 302, 335/304, 306; 324/300, 303, 307, 318, 319, 320, 346; 381/199, 201

[56] References Cited

U.S. PATENT DOCUMENTS

| | | | |
|---|---|---|---|
| 2,355,298 | 8/1944 | Horlacher | 381/195 |
| 3,067,366 | 12/1962 | Hofman | 381/195 |
| 3,419,832 | 12/1968 | Baermann | 335/285 |
| 3,651,283 | 3/1972 | Doschek | 381/195 |
| 4,339,853 | 7/1982 | Lipschitz | 24/155 BR |
| 4,738,824 | 11/1988 | Kobayashi | 381/195 |
| 4,816,796 | 3/1989 | Miyajima et al. | |
| 4,985,678 | 1/1991 | Gangarosa et al. | |

FOREIGN PATENT DOCUMENTS

| | | |
|---|---|---|
| 0170318A1 | 2/1986 | European Pat. Off. |
| 0424808A1 | 5/1991 | European Pat. Off. |
| 63-286142 | 11/1988 | Japan. |
| 2215522 | 9/1989 | United Kingdom. |

OTHER PUBLICATIONS

8108 IEEE Transactions on Magnetics, vol. MAG–22, No. 5, Sep. 1986, New York, USA.

*Primary Examiner*—Brian W. Brown
*Assistant Examiner*—Raymond M. Barrera

[57] ABSTRACT

A magnet assembly has a generally U-shape, the bight of the U including a permanent magnet which generates a magnetic field whose flux passes through a working volume defined between the arms of the U. The dimensions of the assembly are chosen such that:

$$\frac{L_g}{L_m} = \frac{B_r}{2B_g} \quad (1)$$

where:

$L_g$ is the length of the gap between the arms,
$L_m$ is the length of the magnet,
$B_r$ is the remnant field of the magnet, and
$B_g$ is the field in the gap.

18 Claims, 3 Drawing Sheets

MAGNETIC ASSEMBLY FOR A NUCLEAR MAGNETIC RESONANCE IMAGING SYSTEM

BACKGROUND OF THE INVENTION

1. Field of the Invention

The invention relates to magnet assemblies particularly for use in magnetic resonance imaging (MRI).

2. Description of the Related Art

Conventional MRI systems are large superconducting systems and generally have to be carefully mounted in special areas. Although this is acceptable for the purposes of laboratory applications such as spectroscopy and human body imaging, it is not so useful for recently developed applications of MRI.

We have realised that a step towards solving this problem would be achieved by providing a magnet assembly based on permanent magnets rather than the usual superconducting magnets which require associated cryostats and the like to achieve a superconducting condition. Permanent magnet structures for magnetic resonance imaging (MRI) have been previously described. The most compact and economical in materials usage are those described by E. Potenziani and H. A. Leupold (IEEE Transactions on Magnetics Mag-22, 1078–1080, 1986). These make use of "cladding magnets" to oppose the magnetomotive force (mmf) around the outside of the structure. This has the effect of preventing flux leakage so as to most effectively use the permanent magnet material and obtain good field uniformity in the working volume.

A disadvantage of this type of structure is that the working volume is substantially enclosed. This means that the magnet must be large enough to accommodate all the object to be examined, and that there are difficulties when the subject is large. Also when it is required to examine a relatively small volume of a large object, this type of "whole-body" magnet may not be the most economical.

SUMMARY OF THE INVENTION

In accordance with one aspect of the present invention, a magnet assembly has a generally U-shape, wherein the bight of the U includes a permanent magnet which generates a magnetic field whose flux passes through a working volume defined between the arms of the U, and wherein the dimensions of the assembly are chosen such that:

$$\frac{L_g}{L_m} = \frac{B_r}{2B_g} \quad (1)$$

where:

$L_g$ is the length of the gap between the arms,
$L_m$ is the length of the magnet,
$B_r$ is the remnant field of the magnet, and
$B_g$ is the field in the gap.

Magnets made in accordance with the first aspect of the invention have an open side enabling parts of a body to be positioned within the working volume so enabling bodies which are much larger than the magnet itself to be examined. Furthermore, by constructing the magnet assembly from one or more permanent magnets, the assembly can be sited locally to the body to be examined, for example near the well head in the case of rock cores.

In the case of a magnet assembly for use in MRI, the arrangement of the assembly will be such that the magnetic field within the working volume will have a uniformity sufficient for the purposes of performing a MRI experiment.

The uniformity of the field within the working volume can be improved by adding one or more cladding magnets which compensate for the flux leakage which will occur inevitably due to the open sided nature of the assembly. The cladding magnets may be provided in any conventional form as for example described in the paper mentioned above.

The following mathematical analysis illustrates the derivation of the formula set out above for minimising the volume of magnet material.

| Definitions | | |
|---|---|---|
| Units: | | |
| Magnetic field, | H Oersteds | $H_c$ coercive force |
| Flux density, | B Gauss | $B_r$ remnant field |
| Magnetisation | M Gauss | |
| Length | L centimeters | |
| Area | A square centimeters | |
| Magnetomotiveforce | $F = \int HdL$ oersted-cm | |
| Flux | $\phi = \int BdA$ Maxwells | |
| Subscripts: | | |
| m | magnet | |
| g | gap | |
| i | iron | |

Basic Equations:
Flux continuity $$B_g A_g = B_m A_m$$

In practice we must allow for flux leakage. The cladding technique should minimise this but useful access to the field region will cause some leakage. We allow for this writing:

$$B_g A_g = e B_m A_m \text{ where } 0 < e \leq 1.$$

For a "U-shaped magnet" e might be 0.5.

Formulae can be found in the literature for estimating leakage, alternatively, comparison of finite-element calculations with the analysis below will derive the leakage for the geometries of interest.

Ampere's Law

In the absence of electric currents the mmf round a circuit sums to zero. i.e.

$$H_m L_m + H_i L_i = -H_g L_g$$

However if the material of the arms (eg iron) is not saturated, so that B>>H, we can ignore the mmf in the iron: the iron acts as a short circuit to mmf.

Inside the permanent magnet $$B_m = H_m + M$$

For a "hard" material (NdFeB, SmCo etc)

$$M = \text{constant} = B_r (|H_m| < h_c)$$

Combining this with Ampere's Law gives:

$$B_m = B_r - H_g L_g / L_m$$

For the gap $B_g = H_g$ Therefore from flux continuity $$B_g \left( 1 + e \frac{A_m L_g}{A_g L_m} \right) = e \frac{A_m}{A_g} B_r$$

which enables us to design the system.

Optimisation

In a large magnet we will wish to minimise the volume of the permanent magnet. Traditionally this has been done by constructing a "load line" on the demagnetisation curve through the maximum energy point. The use of hard magnetic materials allows a more illuminating approach.

We can re-write the above equation in terms of the volumes, V=AL, of the magnets and the gap, and also in terms of the ratio, x, of magnet length to gap length. Then $$V_m = \frac{V_g}{e(xB_r/B_g - x^2)}$$

Whence to minimise the volume of magnet material $$\frac{L_g}{L_m} = \frac{B_r}{2B_g}$$

For typical bonded NdFeB magnet material, $B_r$=6800 gauss and $H_c$=5800 Oersted. For a 1.5 kgauss magnet therefore, the magnet should be about half the gap length. Note that this analysis is independent of the particular geometry.

Cladding Magnets

The purpose of the cladding magnets, where provided, is to "push" the flux where we want it to go by producing an opposing magnetomotive force. They do not in themselves produce any field in the working volume, but inhibit flux leakage and so enhance both the field strength and field uniformity produced by the main magnet and pole piece assembly.

Within the cladding magnet, B=0 so that $H_m=H_c$.

In the gap, the mmf to be opposed is $H_g L_g = B_g L_g$ so that the thickness of cladding magnet is $$L_{clad} = L_g B_g / H_c.$$

One example of a magnet assembly in accordance with the first aspect of the invention is an assembly of the conventional U-shaped form in which the permanent magnet generates a magnetic field whose magnetisation direction extends along the bight of the U, circulates through the arms of U and across the gap between the arms.

We have developed a new type of magnet assembly in accordance with a second aspect of the present invention which comprises a generally U-shaped cross-section, wherein the bight of the U includes a permanent magnet which generates a magnetic field whose magnetisation direction is substantially parallel with the arms of the U, the magnetic flux passing into a working volume defined within the gap between the arms of the U and returning via the arms.

This is a new configuration of a U or C magnet which has particular advantages.

The magnet assembly is particularly useful for the applications described above in which case the arrangement is such that the uniformity of the field within the working volume is suitable for performing a MRI experiment.

Once again, the magnet assembly preferably includes one or more cladding magnets to confine the magnetic flux within the volume of the assembly and to improve the uniformity of the field within the working volume.

Although it is not essential, in the preferred arrangement, a ferromagnetic pole piece is provided along the face of the permanent magnet which faces towards the working volume. The use of a pole piece helps to level the non-uniformity within the working volume due to variations in the permanent magnet.

The pole piece could have a planar form but is preferably shaped, for example having a triangular front aspect, so as to provide even more control of the field uniformity by adjusting the permeance of different flux paths through the gap.

Each of the magnet assemblies described so far will suffer from some end-effects due to flux leakage. This can be reduced by providing permanent correction magnets at the ends of the magnet assembly, the direction of magnetisation of the correction magnets being substantially parallel with the direction of magnetisation of the permanent magnet of the assembly.

These magnet assemblies can be used in a wide variety of applications including monitoring the human body for drugs, monitoring rock cores to look for oil bearing characteristics, and monitoring for explosives. In these cases the magnet assembly is incorporated into NMR imaging apparatus of otherwise conventional form. The magnet assembly will be designed to receive a body to be inspected, eg. a human body. In this case the magnet assemblies according to the invention are particularly suitable since they are open sided, thus allowing a person to walk between their arms when the assembly is mounted such that the arms extend horizontally.

BRIEF DESCRIPTION OF THE DRAWINGS

Objects and advantages will become apparent and more readily appreciated from the following description of the preferred embodiments taken in conjunction with accompanying drawings of which.

DESCRIPTION OF THE PREFERRED EMBODIMENTS

Figure 1:
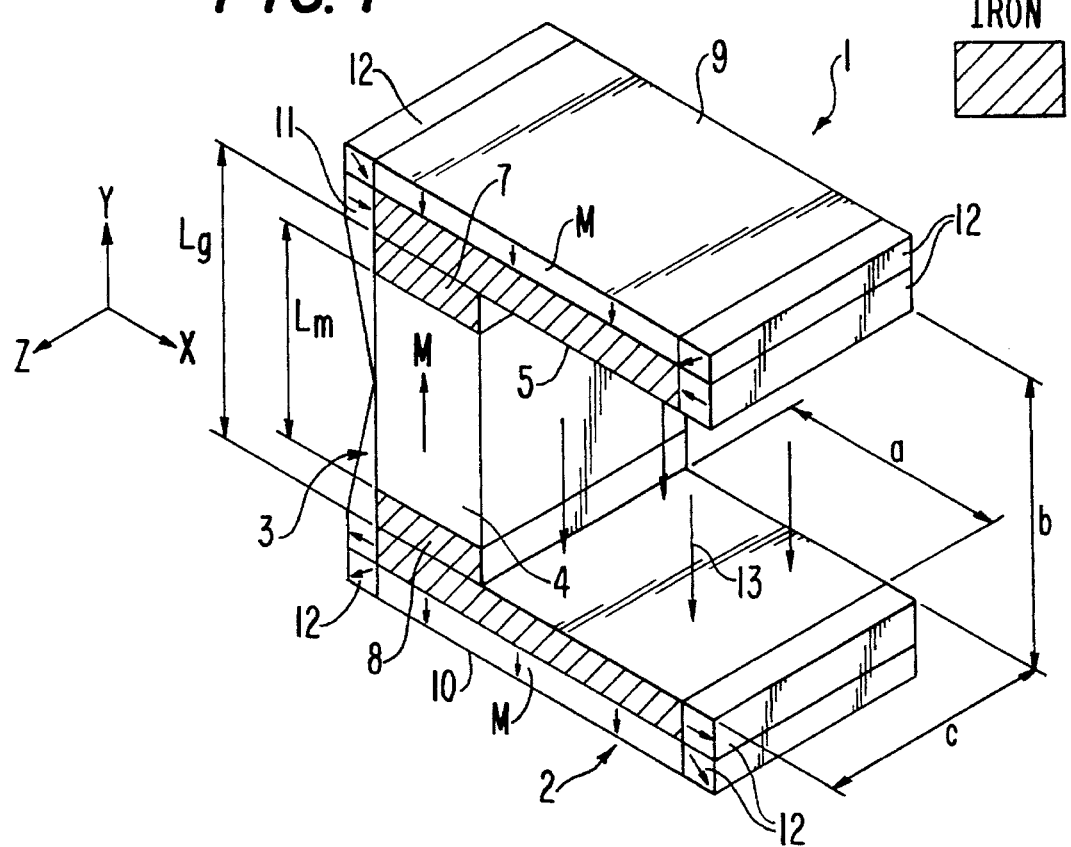
FIG. 1 is a perspective view of a magnet in accordance with a first preferred embodiment of the present invention.

Reference will now be made in detail to the present preferred embodiments of the present invention, examples of which are illustrated in the accompanying drawings, wherein like reference numerals refer to like elements throughout.

The magnet shown in FIG. 1 has a generally U or C shape with a pair of arms 1,2 connected to a bight portion 3. The bight portion 3 comprises a permanent magnet 4 which may be monolithic or made up of smaller blocks of permanent magnet arranged so that the direction of magnetisation M is orthogonal to the planes of the two arms 1,2. Each arm 1,2 is formed by a planar iron piece 5,6 and is connected to the permanent magnet 4 by further iron pieces 7,8.

In order to find the magnetic flux due to the magnet 4 within the gap defined between the arms 1,2, each arm is provided on its outer surface with a cladding magnet 9,10 while the outer surface of the bight portion 3 is also provided with a cladding magnet 11 having a tapered form as described in more detail in the paper mentioned above. Additional cladding magnet sections 12 are provided about the assembly to provide as full cladding as possible while leaving the opening into the gap 3. As can be seen in FIG. 1, the main magnetic flux within the gap passes through the working volume, which is normally spherical, is in the direction 13.

In this example, the cladding magnets prevent flux leakage in the negative X, and both Y directions. Some cladding is provided in the positive X direction, and although not shown in this diagram, similar partial cladding could be applied in both Z directions. However, flux leakage occurs in the positive X direction and in both Z directions. The effect of this on the field uniformity can be obviated either by making the dimensions 'a' and 'c' of the magnet much greater than the size of the volume of interest, or by applying a correction for the finite length, as will be described below.

The volume of the magnetic material forming the permanent magnet 4 is chosen to satisfy equation 1 above and as can be seen in FIG. 1, on the basis of the values for $B_r$ and $H_c$ mentioned above, for a 1.5 kgauss magnet 4, the magnet has a length $L_m$ which is about ½ the gap length $L_g$.

Figure 2:
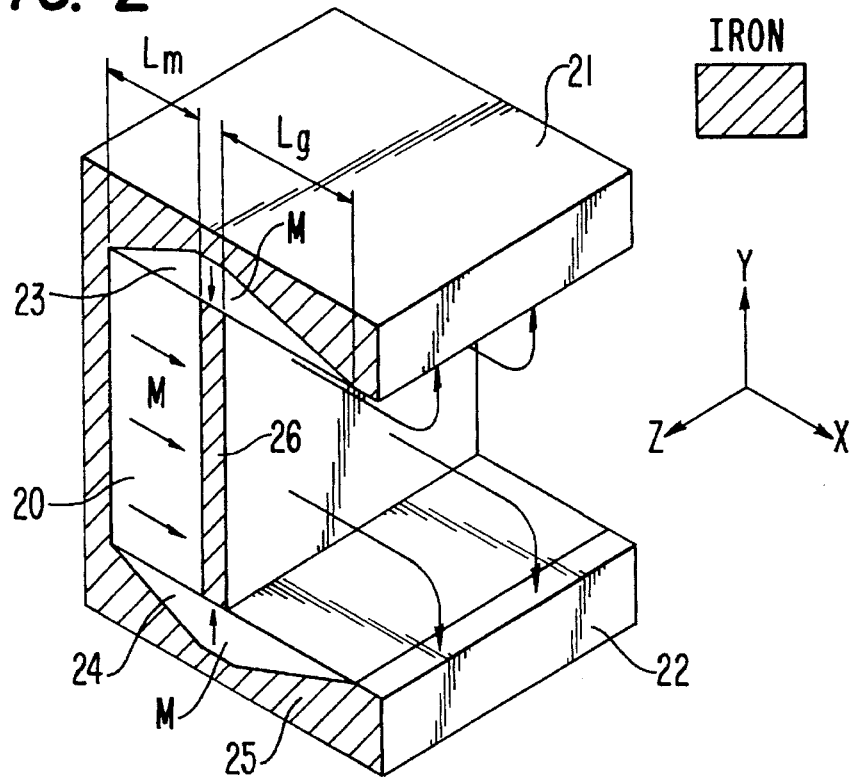
FIG. 2 is a perspective view of a magnet in accordance with a second preferred embodiment of the present invention.

FIG. 2 illustrates another U-shaped magnet known as a "single-sided" magnet. This is formed by a permanent magnet 20 extending between arms 21,22. Cladding magnets 23,24 are provided within the arms 21,22 and the whole is surrounded by an iron casing 25. A planar pole piece 26 of iron is positioned against the face of the permanent magnet 20 facing towards the gap between the arms 21,22. The magnetic flux in this case passes from the magnet 20 directly into the gap between the arms 21,22 and through the working volume and then outwardly into the arms 21,22 before returning to the magnet 20. This configuration is particularly advantageous when the volume to be examined is a relatively flat shape lying parallel to the YZ plane.

Figure 3:
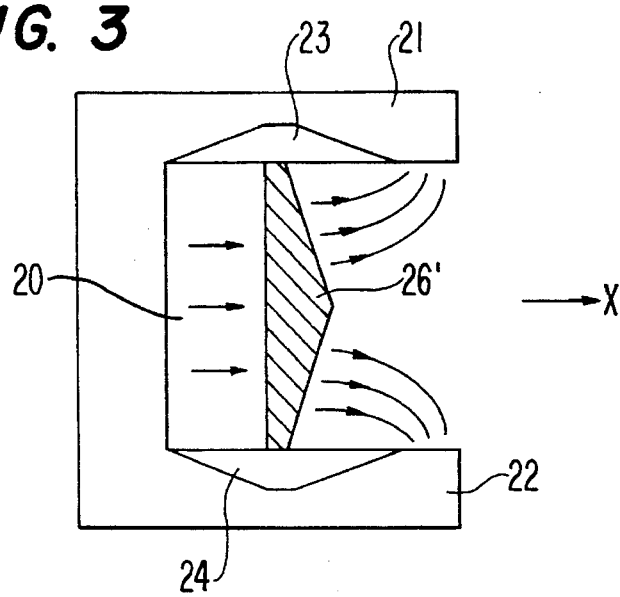
FIG. 3 is a side elevation of a modified form of the magnet shown in FIG. 2.

In the FIG. 2 example, the pole piece 26 is shown flat or planar. Some improvement in the uniformity of the field within the gap can be achieved by shaping the pole piece as shown schematically at 26' in FIG. 3.

Some flux leakage in both the FIG. 1 and FIG. 2 examples will occur in the positive and negative Z directions. This can be reduced by adding correction pieces in the form of additional permanent magnets at the ends of the magnet assembly. This is shown schematically in FIG. 4 for the FIG. 2 example in which cuboid correction magnets 27,28 are positioned alongside each end of the magnet assembly shown in FIG. 2. In the case of the FIG. 1 example, cuboid magnets would be placed alongside each end of the arms 1,2 (four such magnets in all).

Figure 4:
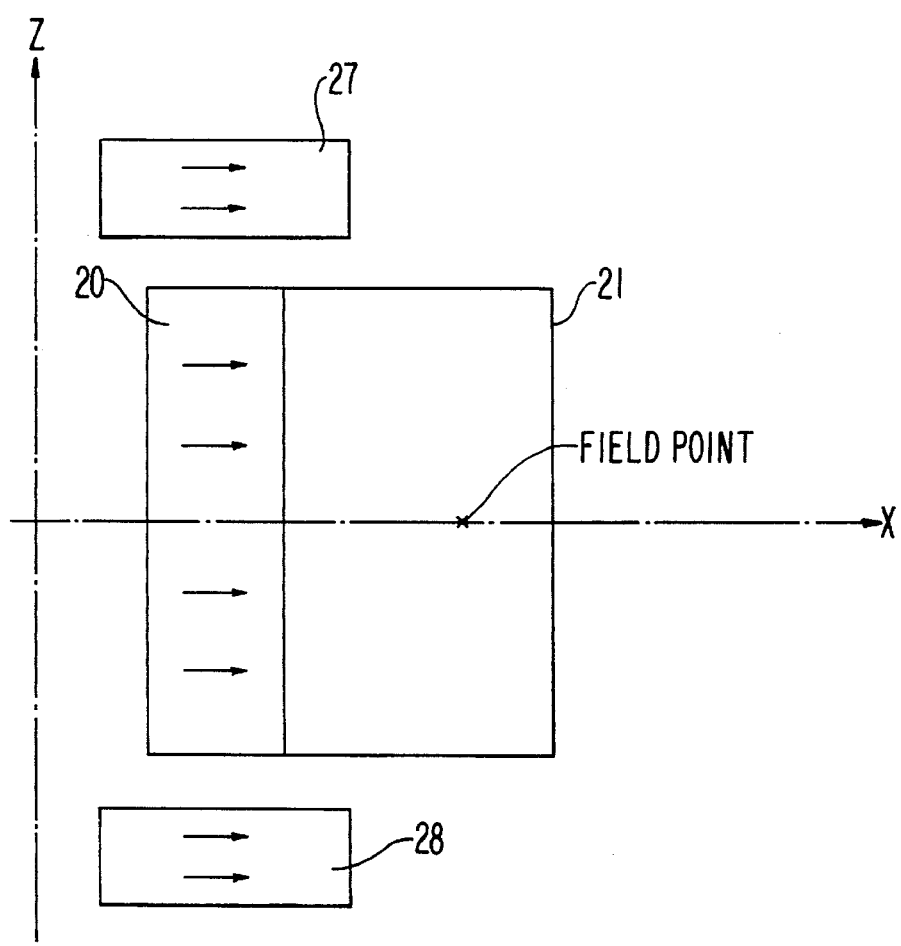
FIG. 4 is a schematic figure plan view of a further modified version of the magnet shown in FIG. 2; and, FIGS. 5, 5A are a schematic, perspective views of a human inspection device.

To illustrate the effect of the correction pieces in the FIG. 4 example, consider the field at a point near the region of interest as described by a Taylor series:

$$B(x+\delta) = B(x) + \delta \frac{\partial B}{\partial x} + \frac{\delta^2}{2!} \frac{\partial^2 B}{\partial x^2} + \ldots$$

The objective is to position the correction pieces such that their contributions to the field derivatives $$\frac{\partial Bx}{\partial x}, \frac{\partial^2 Bx}{\partial x^2}, \frac{\partial^2 Bx}{\partial y^2}$$

are equal and opposite to those of the main field producing slab. As in the case of thick solenoids, analytic expressions do not exist for the field derivatives and numerical techniques must be used. However, the use of "hard" magnetic materials means that the magnetisations are substantially uniform throughout the magnetised material and finite-element calculations are not always necessary. Instead, the magnetised material can be conveniently modelled by current sheets, and the resulting magnetic field and its derivatives at the point of interest rapidly calculated, so as to allow an iterative design process.

Some examples of magnet assemblies are described in the following Tables, in which:

Table 1 shows the field derivatives of a field producing slab.

Table 2 shows the contribution of one of a pair of correction pieces.

Table 3 shows the derivatives of the complete system of slab and two correction pieces.

Table 4 presents a field plot of this system, and FIG. 4 shows these field profiles graphically, together with the dimensions of the system.

As mentioned above, magnets of the type shown in the drawings will be suitable for various applications such as rock core analysis and analysis of suspected drug couriers concealing drug packages on their anatomy. In this latter case, the MRI unit would examine the abdomen, pelvis and upper thorax (to investigate the stomach). Essentially, the device will conduct an MRI experiment, probably producing transverse 2 D slides, in steps from the upper to lower part of the body. A classic imaging experiment would be performed, for example a 2 D spin echo but the data would not be presented as an image. Rather the data sets within slices and between slices would be assembled on a contrast scale and subjected to a pattern recognition exercise. The point being that each drug package would provide an unusual region of uniform signal, however the drug substances were dissolved or combined in carrier fluids. Most particularly the system would be programmed to identify smooth boundaries in space characteristic of the packaged drug and non-typical human gut or organs.

For the purpose of scanning suspects it is important that no hazard is presented by the magnetic field interacting with surgical implants in the brain of which the subject may, or may not be aware. Thus, the magnet must be almost completely shielded and this condition is most easily attained with an iron flux return path and permanent magnet arrays involving cladding magnets as described above. Because high resolution data sets are not required, the magnet need not have good homogeneity over the examination value.

It may be desirable to improve the field locally in the subject using local gradient coils, as described in WO91/17454. This could provide for further reduction in the magnet costs. The use of local gradient coils can provide for strong gradients from small diameter coils that can be driven by low voltage power supplies. The RF technology will be surface coils. The provision of strong/fast gradient allows early echo recovery to improve S/N.

By adopting a C-shaped magnet, with short C arms, the basic position for examination is for the patient to stand inside the magnet, back to the back of the magnet. The gradient coils would line-up with the back and sides of the magnet, but be capable of being moved to contact the patient's body for optimum performance.

Figure 5:
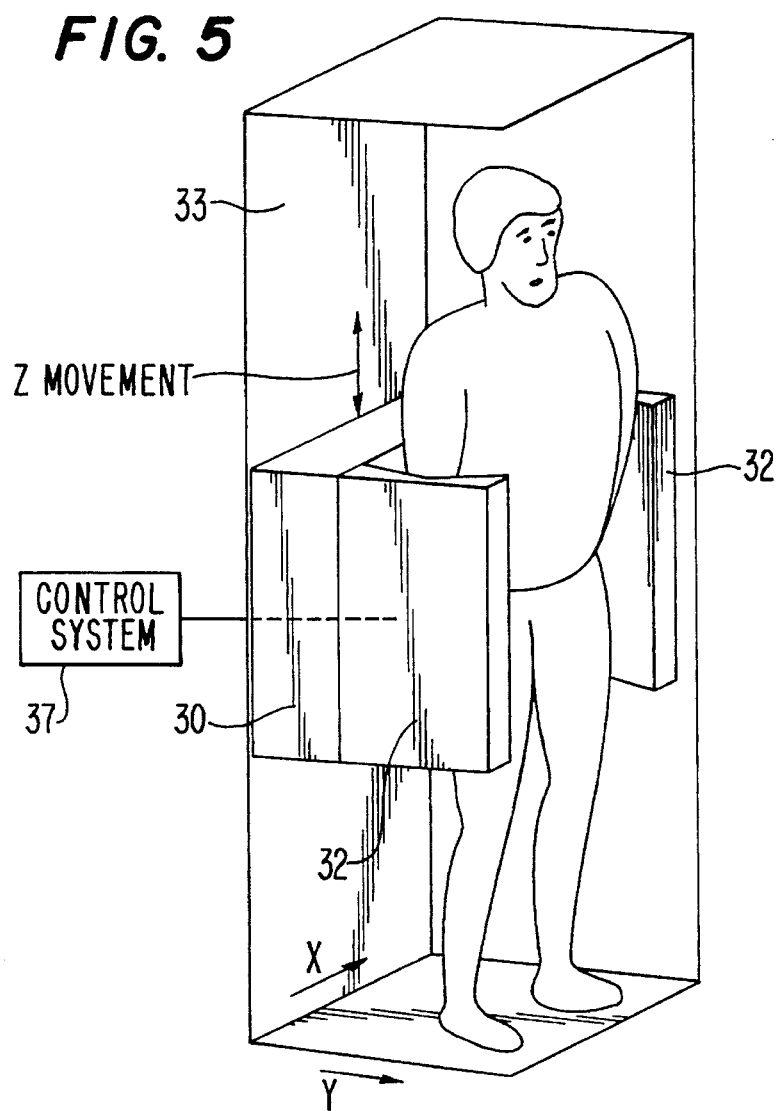
Figure 5A:
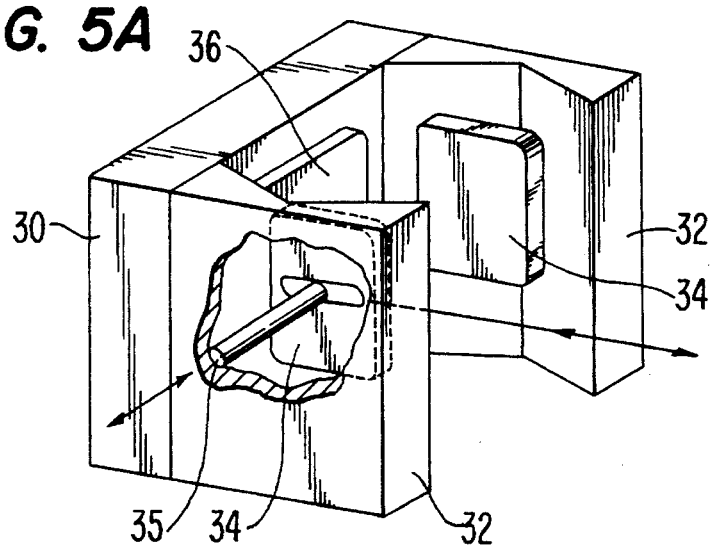

An example of a human body inspection system is illustrated in FIG. 5. The system includes a permanent magnet 30 which may be of any of the types illustrated in FIGS. 1 to 4, the magnet 30 being arranged such that its arms 32 extend in a generally horizontal direction and are sufficiently spaced apart to allow a person to walk between them, as shown. The magnet 30 is housed in an open fronted cabinet 33 which has an overall size similar to that of a conventional telephone kiosk. The cabinet 33 is made of a material which provides a RF screen. Mounted to the magnet 32, as seen in FIG. 5A is an opposed pair of gradient coils 34 which may be adjusted laterally via a pressure adjustment rod 35 extending through the respective arms 32. A further, single sided Y gradient coil 36 is mounted to the rear section of the magnet 30. In addition, RF coils of conventional form will be suitably mounted (not shown). The system shown in FIG. 5 will be coupled with a conventional NMR processing system which will control the gradient magnetic field coils 34, 36 and the RF coils to conduct suitable NMR imaging sequences within a working region between the arms of the magnet 30. In order to allow different parts of a human body to be examined, the magnet 30 is mounted for vertical movement in the cabinet 33, this being achieved by any conventional means such as by using vertically adjustable brackets. This allows the region of high uniformity (the working region) to be centred at any desired position vertically within the human body.

The machine would complete a LD multi-slice imaging sequence and then conduct volumetric shape recognition and comparison activities using pre-programmed standards to search against. The magnet 30 is movable as shown and has local X, Y gradient coils.

A typical Drug Analyzer would comprise the following modules.

1. Magnetic Field Hardware $B^o$ single-side permanent magnet with cladding wings $B^1$ RF from surface coils $B^{ox}$ gradient fields $B^{oy}$ $B^{oz}$ Body contact probe assembly 2. Spectrometer Pulse sequence Memory Data acquisition RF Synthesizer RF Modulator and Quadrature Demodulator RF Pre-amp and Switch RF Power Amplifier Gradient Amplifiers Control and Display Computer (fast fourier transform Reconstruction Display)

3. Pattern Recognition System ("Artificial Intelligence techniques applied to classification of welding defects from automated NDT data" A McNab/I Dunlop, British Journal of NDT, Section 4.2)

3 D array manipulator

Shape recognition memory

Comparison/fit to memory standards

Decision logic, call for more detail, pass or fail

4. Display Unit

This unit would display coarse MRI images in high suspicion cases when a qualified medical examiner was present.

TABLE 1

FIELD DERIVATIVES w.r.t. X range 5.000E+000
at X = 6.000E+001, Y = 0.000E+000, Z = 0.000E+000
gauss centimeters degrees

| order | Bx | By | Bz | Bmod |
|---|---|---|---|---|
| 0 | 3.622E+002 | 0.000E+000 | 0.000E+000 | 3.622E+002 |
| 1 | −1.400E+001 | 0.000E+000 | 0.000E+000 | −1.400E+001 |
| 2 | 3.742E−001 | 0.000E+000 | 0.000E+000 | 3.742E−001 |
| 3 | 3.917E−002 | 0.000E+000 | 0.000E+000 | 3.917E−002 |
| 4 | −1.025E−002 | 0.000E+000 | 0.000E+000 | −1.025E−002 |
| dB4 | −1.668E−002 | 0.000E+000 | 0.000E+000 | −1.668E−002 |
| dBtotal | −3.622E+002 | 0.000E+000 | 0.000E+000 | −3.375E+001 |

TABLE 2

FIELD DERIVATIVES w.r.t. X range 5.000E+000
at X = 5.940E+001, Y = −4.000E+000, Z = 0.000E+000
gauss centimeters degrees

| order | Bx | By | Bz | Bmod |
|---|---|---|---|---|
| 0 | −7.646E+001 | −1.184E+002 | 0.000E+000 | 1.410E+002 |
| 1 | 7.005E+000 | −7.090E−001 | 0.000E+000 | −3.204E+000 |
| 2 | −1.831E−001 | 4.899E−001 | 0.000E+000 | −3.340E−002 |
| 3 | −3.599E−002 | −3.650E−002 | 0.000E+000 | 1.348E−002 |
| 4 | 5.889E−003 | −2.200E−003 | 0.000E+000 | −7.750E−004 |
| dB4 | 9.585E−003 | −3.581E−003 | 0.000E+000 | −1.261E−003 |
| dBtotal | 1.686E+001 | −3.402E−001 | 0.000E+000 | −8.081E+000 |

TABLE 3

FIELD DERIVATIVES w.r.t. X range 5.000E+000
at X = 6.000E+001, Y = 0.000E+000, Z = 0.000E+000
gauss centimeters degrees

| order | Bx | By | Bz | Bmod |
|---|---|---|---|---|
| 0 | 2.092E+002 | 1.421E−014 | 0.000E+000 | 2.092E+002 |
| 1 | 1.025E−002 | −4.500E−015 | 0.000E+000 | 1.025E−002 |
| 2 | 8.031E−003 | −3.657E−014 | 0.000E+000 | 8.031E−003 |
| 3 | −3.281E−002 | 6.366E−015 | 0.000E+000 | −3.281E−002 |
| 4 | 1.550E−003 | 7.130E−014 | 0.000E+000 | 1.550E−003 |
| dB4 | 2.523E−003 | 1.161E−013 | 0.000E+000 | 2.523E−003 |
| dBtotal | −2.092E+002 | 7.105E−015 | 0.000E+000 | −3.221E−002 |

FIELD DERIVATIVES w.r.t. Y range 5.000E+000
at X = 6.000E+001, Y = 0.000E+000, Z = 0.000E+000
gauss centimeters degrees

| order | Bx | By | Bz | Bmod |
|---|---|---|---|---|
| 0 | 2.092E+002 | 1.421E−014 | 0.000E+000 | 2.092E+002 |
| 1 | −7.451E−010 | −1.101E−002 | 0.000E+000 | 0.000E+000 |
| 2 | −8.089E−003 | 0.000E+000 | 0.000E+000 | −8.092E−003 |
| 3 | 0.000E+000 | −3.368E−002 | 0.000E+000 | 0.000E+000 |
| 4 | 1.675E−003 | 0.000E+000 | 0.000E+000 | 1.700E−003 |
| dB4 | 2.726E−003 | 0.000E+000 | 0.000E+000 | 2.767E−003 |
| dBtotal | −2.255E−002 | −1.152E−001 | 0.000E+000 | −2.252E−002 |

TABLE 4

FIELD PLOTS gauss centimeters degrees

Z = 0.000E+000
Y = 0.000E+000

| X | Bx | By | Bz | Bmod |
|---|---|---|---|---|
| 4.000E+001 | 2.300E+002 | −3.553E−015 | 0.000E+000 | 2.300E+002 |
| 4.500E+001 | 2.228E+002 | 1.954E−014 | 0.000E+000 | 2.228E+002 |
| 5.000E+001 | 2.145E+002 | −1.776E−014 | 0.000E+000 | 2.145E+002 |
| 5.500E+001 | 2.100E+002 | 1.066E−014 | 0.000E+000 | 2.100E+002 |
| 6.000E+001 | 2.092E+002 | 1.421E−014 | 0.000E+000 | 2.092E+002 |
| 6.500E+001 | 2.088E+002 | 1.066E−014 | 0.000E+000 | 2.088E+002 |
| 7.000E+001 | 2.054E+002 | 1.066E−014 | 0.000E+000 | 2.054E+002 |
| 7.500E+001 | 1.983E+002 | −4.619E−014 | 0.000E+000 | 1.983E+002 |

Y = 5.000E+000

| X | Bx | By | Bz | Bmod |
|---|---|---|---|---|
| 4.000E+001 | 2.333E+002 | 5.031E+000 | 0.000E+000 | 2.333E+002 |
| 4.500E+001 | 2.235E+002 | 9.948E+000 | 0.000E+000 | 2.237E+002 |
| 5.000E+001 | 2.121E+002 | 7.428E+000 | 0.000E+000 | 2.122E+002 |
| 5.500E+001 | 2.078E+002 | 1.692E+000 | 0.000E+000 | 2.078E+002 |
| 6.000E+001 | 2.092E+002 | −7.773E−001 | 0.000E+000 | 2.092E+002 |
| 6.500E+001 | 2.104E+002 | 1.197E+000 | 0.000E+000 | 2.104E+002 |
| 7.000E+001 | 2.075E+002 | 5.261E+000 | 0.000E+000 | 2.076E+002 |
| 7.500E+001 | 1.999E+002 | 9.133E+000 | 0.000E+000 | 2.001E+002 |

Y = 1.000E+001

| X | Bx | By | Bz | Bmod |
|---|---|---|---|---|
| 4.000E+001 | 2.487E+002 | 1.183E+001 | 0.000E+000 | 2.489E+002 |
| 4.500E+001 | 2.256E+002 | 2.980E+001 | 0.000E+000 | 2.276E+002 |
| 5.000E+001 | 2.005E+002 | 1.830E+001 | 0.000E+000 | 2.013E+002 |
| 5.500E+001 | 1.990E+002 | −1.125E+000 | 0.000E+000 | 1.990E+002 |
| 6.000E+001 | 2.099E+002 | −6.589E+000 | 0.000E+000 | 2.100E+002 |
| 6.500E+001 | 2.167E+002 | 4.110E−001 | 0.000E+000 | 2.167E+002 |
| 7.000E+001 | 2.145E+002 | 1.096E+001 | 0.000E+000 | 2.148E+002 |
| 7.500E+001 | 2.051E+002 | 1.964E+001 | 0.000E+000 | 2.060E+002 |

TABLE 4-continued

| FIELD PLOTS gauss centimeters degrees | | | | |
|---|---|---|---|---|
| Y = 1.500E+001 | | | | |
| X | Bx | By | Bz | Bmod |
| 4.000E+001 | 3.087E+002 | 2.314E+001 | @000E+000 | 3.096E+002 |
| 4.500E+001 | 2.273E+002 | 9.164E+001 | 0.000E+000 | 2.451E+002 |
| 5.000E+001 | 1.565E+002 | 3.503E+001 | 0.000E+000 | 1.604E+002 |
| 5.500E+001 | 1.780E+002 | −2.300E+001 | 0.000E+000 | 1.795E+002 |
| 6.000E+001 | 2.173E+002 | −2.563E+001 | 0.000E+000 | 2.188E+002 |
| 6.500E+001 | 2.333E+002 | −3.035E+000 | 0.000E+000 | 2.333E+002 |
| 7.000E+001 | 2.287E+002 | 1.922E+001 | 0.000E+000 | 2.295E+002 |
| 7.500E+001 | 2.140E+002 | 3.378E+001 | 0.000E+000 | 2.166E+002 |
| Y = 2.000E+001 | | | | |
| X | Bx | By | Bz | Bmod |
| 4.000E+001 | 6.008E+002 | 4.305E+001 | 0.000E+000 | 6.023E+002 |
| 4.500E+001 | 1.768E+002 | 3.498E+002 | 0.000E+000 | 3.920E+002 |
| 5.000E+001 | −9.368E+000 | 2.107E+001 | 0.000E+000 | 2.306E+001 |
| 5.500E+001 | 1.532E+002 | −1.142E+002 | 0.000E+000 | 1.911E+002 |
| 6.000E+001 | 2.553E+002 | −6.609E+001 | 0.000E+000 | 2.638E+002 |
| 6.500E+001 | 2.707E+002 | −2.853E+000 | 0.000E+000 | 2.707E+002 |
| 7.000E+001 | 2.520E+002 | 3.625E+001 | 0.000E+000 | 2.546E+002 |
| 7.500E+001 | 2.256E+002 | 5.529E+001 | 0.000E+000 | 2.323E+002 |

We claim:

1. A magnet assembly having a generally U-shape, wherein the bight of the U includes a permanent magnet which generates a magnetic field whose flux passes through a working volume defined between the arms of the U, and wherein the dimensions of the assembly are chosen such that:

$$\frac{L_g}{L_m} = \frac{B_r}{2B_g} \quad (1)$$

where:

$L_g$ is the length of the gap between the arms, $L_m$ is the length of the magnet, $B_r$ is the remnant field of the magnet, and $B_g$ is the field in the gap.

2. An assembly according to claim 1, wherein the permanent magnet generates a magnetic field whose magnetisation direction extends along the bight of the U, circulates through the arms of the U and across the gap between the arms.

3. An assembly according to claim 2, further comprising one or more cladding magnets which compensate for flux leakage from the assembly.

4. An assembly according to claim 2, further comprising one or more permanent, correction magnets at the ends of the magnet assembly, the direction of magnetisation of the correction magnets being substantially parallel with the direction of magnetisation of the permanent magnet of the assembly.

5. An assembly according to claim 1, further comprising one or more cladding magnets which compensate for flux leakage from the assembly.

6. An assembly according to claim 5, wherein the cladding magnets are provided on each externally facing surface of the assembly.

7. An assembly according to claim 5, further comprising one or more permanent, correction magnets at the ends of the magnet assembly, the direction of magnetisation of the correction magnets being substantially parallel with the direction of magnetisation of the permanent magnet of the assembly.

8. An assembly according to claim 1, further comprising one or more permanent, correction magnets at the ends of the magnet assembly, the direction of magnetisation of the correction magnets being substantially parallel with the direction of magnetisation of the permanent magnet of the assembly.

9. A nuclear magnetic resonance imaging system comprising a generally U-shaped cross-section, wherein the bight of the U includes a permanent magnet which generates a magnetic field whose magnetization direction is substantially parallel with the arms of the U, the magnetic flux passing into a working volume defined within the gap between the arms of the U and returning via the arms, and a ferro-magnetic pole piece provided along the face of the permanent magnet and facing towards the working volume, the pole piece provided with a triangular front aspect.

10. An assembly according to claim 9, further comprising one or more cladding magnets which compensate for flux leakage from the assembly.

11. An assembly according to claim 9, further comprising one or more permanent, correction magnets at the ends of the magnet assembly, the direction of magnetisation of the correction magnets being substantially parallel with the direction of magnetisation of the permanent magnet of the assembly.

12. A nuclear magnetic resonance imaging system comprising a magnet assembly having a generally U-shape, wherein the bight of the U includes a permanent magnet which generates a magnetic field whose flux passes through a working volume defined between the arms of the U, and wherein the dimensions of the assembly are chosen such that:

$$\frac{L_g}{L_m} = \frac{B_r}{2B_g} \quad (1)$$

where:

$L_g$ is the length of the gap between the arms, $L_m$ is the length of the magnet, $B_r$ is the remnant field of the magnet, and $B_g$ is the field in the gap.

13. A system according to claim 12, wherein the magnet assembly is mounted such that the arms of the assembly project substantially horizontally and are spaced apart sufficiently to accommodate a human body.

14. A system according to claim 12, wherein the magnet assembly is vertically adjustable.

15. A nuclear magnetic resonance imaging system comprising:

a generally U-shaped cross-section, wherein the bight of the U includes a permanent magnet which generates a magnetic field whose magnetization direction is substantially parallel with the arms of the U, the magnetic flux passing into a working volume defined within the gap between the arms of the U and returning via the arms; and one or more cladding magnets which compensate for flux leakage from the assembly.

16. A nuclear magnetic resonance imaging system according to claim 15, further comprising:

a ferro-magnetic pole piece provided along the face of the permanent magnet and facing towards the working volume.

17. A nuclear magnetic resonance imaging system comprising:

a generally U-shaped cross-section, wherein the bight of the U includes a permanent magnet which generates a magnetic field whose magnetization direction is substantially parallel with the arms of the U, the magnetic flux passing into a working volume defined within the gap between the arms of the U and returning via the arms; and one or more permanent, correction magnets at the ends of the magnet assembly, the direction of magnetization of the correction magnets being substantially parallel with the direction of magnetization of the permanent magnet of the assembly.

18. A nuclear magnetic resonance imaging system according to claim 17, further comprising:

a ferro-magnetic pole piece provided along the face of the permanent magnet and facing towards the working volume.

* * * * *